(12) United States Patent
Pitel

(10) Patent No.: US 6,299,055 B1
(45) Date of Patent: Oct. 9, 2001

(54) MANUFACTURING PROCESSES OF SERVICE BOXES AND THEIR PARTS

(75) Inventor: Jose Antonio Cubero Pitel, Vallas (ES)

(73) Assignee: Lear Automotive Dearborn, Inc., Southfield, MI (US)

( * ) Notice: Subject to any disclaimer, the term of this patent is extended or adjusted under 35 U.S.C. 154(b) by 0 days.

(21) Appl. No.: 09/423,442

(22) PCT Filed: Apr. 23, 1998

(86) PCT No.: PCT/US98/08169

§ 371 Date: Nov. 8, 1999

§ 102(e) Date: Nov. 8, 1999

(87) PCT Pub. No.: WO98/51135

PCT Pub. Date: Nov. 12, 1998

(30) Foreign Application Priority Data

May 9, 1997 (ES) .................................................. 9700994

(51) Int. Cl.[7] ........................... B23K 31/00; B23K 31/02; H05K 3/30
(52) U.S. Cl. ..................... 228/175; 228/180.22; 29/837
(58) Field of Search ............................... 228/175, 180.22, 228/178, 226; 252/514; 29/837

(56) References Cited

U.S. PATENT DOCUMENTS

| 3,888,639 | * | 6/1975 | Hastings et al. | 29/626 |
|---|---|---|---|---|
| 4,242,719 | * | 12/1980 | Conley | 361/400 |
| 4,290,195 | * | 9/1981 | Rippere | 29/837 |
| 4,515,304 | * | 5/1985 | Berger | 228/136 |
| 4,982,376 | * | 1/1991 | Megens et al. | 361/400 |
| 5,144,535 | * | 9/1992 | Megens et al. | 361/400 |
| 5,155,904 | * | 10/1992 | Majd | 29/837 |
| 5,324,892 | * | 6/1994 | Granier et al. | 174/250 |
| 5,374,848 | * | 12/1994 | Otani et al. | 257/685 |
| 5,477,419 | * | 12/1995 | Goodman et al. | 361/760 |
| 5,536,908 | * | 7/1996 | Etchells et al. | 174/257 |
| 5,601,227 | * | 2/1997 | Kroebel Nieto et al. | 228/180.1 |
| 5,656,798 | * | 8/1997 | Kubo et al. | 174/265 |
| 5,690,270 | * | 11/1997 | Gore | 228/180.22 |
| 5,803,344 | * | 9/1998 | Stankavich et al. | 228/180.22 |
| 5,839,190 | * | 11/1998 | Sullivan | 29/840 |
| 6,076,726 | * | 7/1998 | Hoffmeyer et al. | 228/180.22 |

FOREIGN PATENT DOCUMENTS

| 3829153 A | * | 3/1989 | (DE) | 228/175 |
|---|---|---|---|---|
| 0177042 A | * | 4/1986 | (EP) | 228/175 |
| 003829153A1 | * | 3/1989 | (EP) | 228/175 |
| 04245495 | * | 9/1992 | (JP) | 29/840 |

* cited by examiner

Primary Examiner—Tom Dunn
Assistant Examiner—L. Edmondson
(74) Attorney, Agent, or Firm—Brooks & Kushman P.C.

(57) ABSTRACT

A method for welding electronic components (13) to a circuit board (10) having two conductive layers (12) includes the steps of inserting an electronic component (13) into a first surface of circuit board (10), welding the electronic component (13) to a first conductive face of the circuit board (10) using a first welding material (20), and subsequently welding the electronic component (13) to a second conductive face of the circuit board (10) using a second welding material (22) having a melting point lower than that of the first welding material (20).

8 Claims, 1 Drawing Sheet

MANUFACTURING PROCESSES OF SERVICE BOXES AND THEIR PARTS

BACKGROUND OF THE INVENTION

In order to obtain an improvement in welding components to a printed circuit, especially for transverse components welded at both faces of a printed circuit, welding materials having different characteristics are used in each end of the components in such a way that one weld is not qualitatively affected by the other weld. More specifically, this invention is a method that includes using welding alloys of different melting points for each face of the component in order to avoid re-melting during the second welding which is typically made with the alloy tin/lead having a melting point of 183° C.

The present invention consists of improvements in the manufacturing processes of service boxes and their parts whose novel characteristics in manufacturing, shaping and design fulfill the role for which had been specifically designed with a maximum safety and efficiency.

In Spanish Patent No. 9 302 193 to the same Applicant, improvements in the manufacturing processes of service boxes and their parts was disclosed which relate to Spanish Patent No. 9 200 325 which disclosed improvements in the manufacturing processes of service boxes and their parts. These improvements consist of the use of special alloys in the welding operations of the type corresponding to the formula 95 Sn, 5 Sb, and 52 Sn, 45 Pb, 3 Sb, as well as to the application of a new substrate material formed with glass fibers in the outside surface and epoxy-paper on the inside surface, and finally a varnish or coating of a photo-sensitive bath, a water repellent, and corrosion resistant liquid.

The practice in the application of these improvements has introduced new technical factors and have led to the discovery of a little known phenomenon, which had as a consequence, the creation of a novel technical solution and an improvement in the manufacturing technologies of service boxes and their parts, in which welding procedures are a very important part of same.

The role of the welding is capital since it insures the electrical union between two conductive materials thus avoiding high tension falls and keeping the electrical unions stable.

Mechanically speaking, the welding also has a role since it must support the components in order to guarantee the passage of power. That mechanical union must be resistant to vibration., temperature changes, humidity, corrosion and other environmental factors.

Currently, the welding made by a wave bath using an alloy of tin-lead has the following characteristics: melting point 183° C., eutectic T1=TS, and electrical conductivity 11.50% of copper.

In order to obtain an improvement in the welding, especially of transverse components welded at both faces of a printed circuit, welding processes of different characteristics are needed in each end of the components, in order that each welding is not qualitatively affected by the other.

SUMMARY OF THE INVENTION

In order to avoid the consequences, it has b(en found that using welding alloys with different melting points for each weld at each of the faces of the component avoids re-melting during the second welding. The second welding is carried out using ordinary tin-lead alloy which has a melting point of 183° C. At the same time, the new alloy must have a greater resistance to thermo-mechanical fatigue. The new welding alloy must meet the following requirements: eutectic T1=TS, 183° C.<Tf<200° C., better physical properties, be both free of lead and other contaminants, possess good weldability, have a suitable cost, and be adaptable to current manufacturing equipment.

Among all the commercially available alloy,s for wave welding, a binary tin and silver (Sn—Ag) based alloy has been selected which fulfills the above requirements.

Out of the tests performed with the above-mentiioned improvements, an amelioration has been achieved which includes that the Sn—Ag welding does not re-melt during the second welding operations, the Sn—Ag welding has better mechanical properties giving better resistance to the thermo-mechanical fatigue, and the higher melt temperature of the Sn—Ag welding gives a better thermal resistance against power cycling.

BRIEF DESCRIPTION OF THE DRAWINGS

Other details and characteristics of the present invention will be manifest through the reading of the description given hereinbelow, in which reference is made to the Figures attached to this description, where are depicted the above details. These details are given as an example, referring to a case of a possible practical embodiment, but is not limited to the details outlined therein. Therefore, this description must be considered from an illustrative point of view and with no limitations whatsoever.

DETAILED DESCRIPTION

Figure 1:
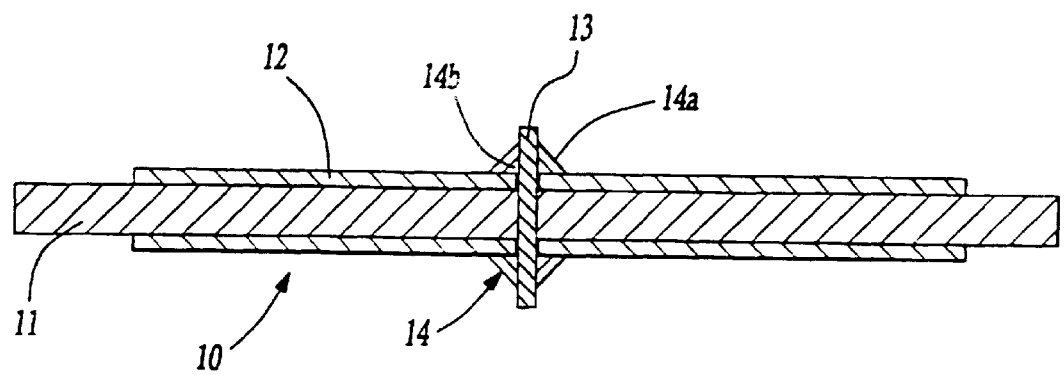
FIG. 1 is a longitudinal section in elevation of a printed circuit according to the prior art.

In one preferred embodiment of the present invention, as shown in FIG. 1, the printed circuit (10) is formed as is known in the art of a dielectric substrate (11) which is coated on both faces with a conductive circuit (12) affected by the corresponding tracks obtained by any of the actually known systems. Among the methods for contacting the upper conductive layer (12) with the lower layer are insertion pins (13) which electrically connect the upper conductive layer (12) with the lower layer. Conventionally, welding the pins (13) in a wave welding machine results in the welding (14).

As discussed above, when welding one of the faces (12) there is formed a first welding that later when welding the pin (13) at the other face, re-melts a portion of what has been previously welded to form two superimposed weldings that are shown in the Figure and numbered as (14a) and (14b).

In order to avoid this disadvantage, the wave welding process according to this invention, has been modified in such a way that in the first welding at the components face there preferably is employed an alloy with a melting point according to the characteristics of the new Sn—Ag alloy in order to perform later a second welding operation in the other face. The second welding operation preferably is carried out using wave weldi:ng with a tin-lead alloy with a melting point of 183° C.

Figure 2:
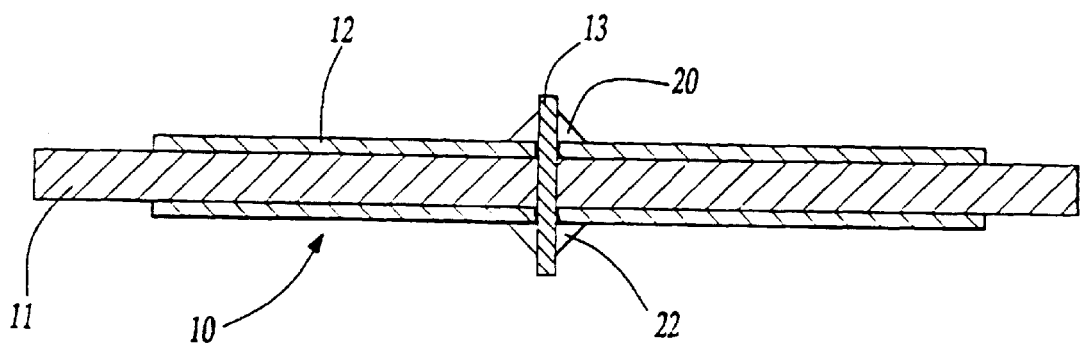
FIG. 2 is a longitudinal section in elevation of a printed circuit according to this invention.

With the above procedure and the use of two different alloys, the undesired effects in the above described welding operations are avoided. FIG. 2 illustrates a completed weld done according to this invention. The first weld 20 is performed using a tin-silver alloy having a melting temperature that is greater than 183° C. The preferred range for the melting point of the alloy used in the first weld is between about 183° C. and 200° C. A second, subsequent weld 22 is performed using a tin-lead alloy having a melting point that is lower than that of the tin-silver alloy. Once the weld 22 is completed, both welds 20 and 22 have good characteristics; no superimposed weldings are formed.

The invention has been described in all illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, the invention may be practiced, otherwise than as specifically described.

What is claimed is:

1. A method for welding electronic components to a circuit board having two conductive layers disposed on a dielectric substrate includes the steps of:

inserting an electronic component through a hole in the dielectric substrate of the circuit board;

welding the electronic component to a first conductive layer on a first outer face of the circuit board using a first welding material having a first melting point, wherein the first welding material comprises a Sn—Ag alloy; and subsequently welding the electronic component to a second conductive layer on a second outer face of the circuit board using a second welding material having a second melting point that is lower than the first melting point of the first welding material.

2. The method according to claim 1, wherein the second welding material is an Sn—Pb alloy.

3. The method according to claim 1, wherein the first melting point of the first welding material is greater than 183° C.

4. The method according to claim 3, wherein the first melting point of the first welding material is in the range between approximately 183° C. and 200° C.

5. A circuit board comprising:

a dielectric substrate having two opposed outer faces having conductive layers on each of said outer faces, and at least one through hole extending between said outer face; and an electronic component extending through said through hole such that portions of said electronic component extends beyond each of said conductive layers, wherein a first weld joint is formed outwardly between the electronic component and the conductive layer on a first outer face, and a second weld joint is formed outwardly between the electronic component and the conductive layer on a second outer face, wherein one of said first and second weld joints is formed of a first welding material comprising a Sn—Ag alloy having a higher melting point than the other of said weld joints.

6. The circuit board of claim 5, wherein one of the first and second weld joints comprises a second welding material formed of a Sn—Pb alloy.

7. The circuit board of claim 5, wherein the melting point of the Sn—Ag alloy is greater than 183° C.

8. The circuit board of claim 5, wherein the first melting point of the Sn—Ag alloy is in the range between approximately 183° C. and 200° C.

* * * * *